United States Patent
Chua et al.

(10) Patent No.: US 12,293,943 B2
(45) Date of Patent: May 6, 2025

(54) GOLD THROUGH SILICON MASK PLATING

(71) Applicant: Lam Research Corporation, Fremont, CA (US)

(72) Inventors: Lee Peng Chua, Beaverton, OR (US); Defu Liang, Wilsonville, OR (US); Jacob Kurtis Blickensderfer, Tualatin, OR (US); Thomas A Ponnuswamy, Sherwood, OR (US); Bryan L. Buckalew, Tualatin, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 137 days.

(21) Appl. No.: 17/430,617

(22) PCT Filed: Feb. 13, 2020

(86) PCT No.: PCT/US2020/018106
§ 371 (c)(1),
(2) Date: Aug. 12, 2021

(87) PCT Pub. No.: WO2020/168074
PCT Pub. Date: Aug. 20, 2020

(65) Prior Publication Data
US 2022/0216104 A1    Jul. 7, 2022

Related U.S. Application Data (60) Provisional application No. 62/805,604, filed on Feb. 14, 2019.

(51) Int. Cl.
*H01L 21/768* (2006.01)
*C25D 3/48* (2006.01)
(Continued)

(52) U.S. Cl.
CPC .......... *H01L 21/76873* (2013.01); *C25D 3/48* (2013.01); *C25D 5/022* (2013.01);
(Continued)

(58) Field of Classification Search
None
See application file for complete search history.

(56) References Cited

U.S. PATENT DOCUMENTS

2004/0018722 A1    1/2004  Tarumi et al.
2005/0056545 A1*   3/2005  Mizutani .................. C25D 3/48
                                                         205/266

(Continued)

FOREIGN PATENT DOCUMENTS

CN    101640183 A    2/2010
CN    102644095 A    8/2012
(Continued)

OTHER PUBLICATIONS

Mandich, N.V. "Pulse and pulse-reverse electroplating", Metal Finishing, vol. 97, Issue 1, Supplement 1, 1999, p. 382-387, ISSN 0026-0576, https://doi.org/10.1016/S0026-0576(99)80039-7 (Year: 1999).*

(Continued)

*Primary Examiner* — Louis J Rufo
(74) *Attorney, Agent, or Firm* — Schwegman Lundberg & Woessner, P.A.

(57) ABSTRACT

Systems and methods are provided for method for etch assisted gold (Au) through silicon mask plating (EAG-TSM). An example method comprises providing a seed layer on a substrate and providing a silicon mask on at least a portion of the seed layer on the substrate. The silicon mask includes one or more via to be filled with Au. The masked substrate is subjected to at least one processing cycle, each processing cycle including an Au plating sub-step and an (Continued)

etch treatment sub-step. The cycles are repeated until a selected via fill thickness is achieved.

12 Claims, 9 Drawing Sheets (51) Int. Cl.
　　　*C25D 5/02*　　　(2006.01)
　　　*C25D 7/12*　　　(2006.01)
　　　*C25D 17/06*　　(2006.01)
　　　*H01L 21/311*　　(2006.01)
　　　*H01L 23/48*　　(2006.01)

(52) U.S. Cl.
　　　CPC .............. *C25D 7/123* (2013.01); *C25D 17/06* (2013.01); *H01L 21/31144* (2013.01); *H01L 21/76877* (2013.01); *H01L 21/76898* (2013.01); *H01L 23/481* (2013.01)

(56) References Cited

U.S. PATENT DOCUMENTS

| | | | |
|---|---|---|---|
| 2006/0118952 A1* | 6/2006 | Suzuki | C25D 5/022 257/769 |
| 2007/0202686 A1* | 8/2007 | Dixit | C25D 5/18 327/172 |
| 2017/0287728 A1* | 10/2017 | Dahlberg | H01L 21/76898 |
| 2018/0279486 A1 | 9/2018 | Matsumoto | |
| 2019/0093248 A1* | 3/2019 | Josell | C25D 5/10 |

FOREIGN PATENT DOCUMENTS

| | | | |
|---|---|---|---|
| CN | 103715132 A | 4/2014 | |
| CN | 106486415 | 3/2017 | |
| CN | 107820731 A | 3/2018 | |
| CN | 105845558 B | 1/2021 | |
| CN | 113424309 | 9/2021 | |
| JP | 2003096596 A | 4/2003 | |
| JP | 2004043958 A * | 2/2004 | .............. C25D 3/48 |
| JP | 2014110284 A | 6/2014 | |
| WO | WO-2006004809 A1 | 1/2006 | |

OTHER PUBLICATIONS

"International Application Serial No. PCT US2020 018106, International Preliminary Report on Patentability mailed Aug. 26, 2021", 6 pages.

International Application Serial No. PCT/US2020/018106, International Search Report mailed Jun. 11, 2020, 3 pgs.

International Application Serial No. PCT/US2020/018106, Written Opinion mailed Jun. 11, 2020, 4 pgs.

Chinese Application Serial No. 202080014782.8, Office Action mailed Mar. 6, 2024, w/ English translation, 14 pgs.

Korean Application Serial No. 10-2021-7029526, Notice of Preliminary Rejection mailed Jul. 31, 2024, W/English Translation, 10 pgs.

"Korean Application Serial No. 10-2021-7029526, Response filed Sep. 30, 2024 to Notice of Preliminary Rejection mailed Jul. 31, 2024", W English Claims, 17 pgs.

"Chinese Application Serial No. 202080014782.8, Office Action mailed Oct. 10, 2024", W English Translation, 20 pgs.

"Chinese Application Serial No. 202080014782.8, Response filed Sep. 6, 2024 to Office Action mailed Mar. 6, 2024", w English claims, 3 pgs.

"Chinese Application Serial No. 202080014782.8, Response filed Dec. 10, 2024 to Office Action mailed Oct. 10, 2024", w English claims, 3 pgs.

\* cited by examiner

GOLD THROUGH SILICON MASK PLATING

CLAIM OF PRIORITY

This application is a U.S. National Stage Filing under 35 U.S.C. 371 from International Application No. PCT/US2020/018106, filed on Feb. 13, 2020, and published as WO 2020/168074 A1 on Aug. 20, 2020, which claims the benefit of priority to U.S. Provisional Patent Application No. 62/805,604, to Chua et al, entitled "Gold Through Silicon Mask Plating" filed on Feb. 14, 2019, each of which is incorporated by reference herein in its entirety.

FIELD

The present disclosure relates generally to gold through silicon mask (TSM) plating, particularly for substrate processing in semiconductor manufacturing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Forming metal structures at a micron scale is most commonly done by plating operations performed by using one or more pre-patterned sacrificial masks. One method employs an organic photoresist mask. This method is commonly referred to as through-resist plating. Some manufacturers in the Wafer Level Packaging (WLP) industry widely use such methods to form copper (Cu) and gold (Au) redistribution layers (RDL), flip-chip-bump interconnects of Cu, nickel (Ni) and tin (Sn) alloy solder, and to perform Au bumping. Even more complex structures such as those found in Micro-Electro-Mechanical Systems (MEMS) applications also utilize through-resist plating technology.

While providing another option, TSM plating with Au also presents some formidable difficulties. The Au metal readily deposits spuriously on an Si mask, and even more so at via openings. Such undesired Au depositions on Si continue to grow, often more intensely at a via entrance which may attenuate desired Au via fill plating patterns. Eventually, the via entrance or at least parts of the via entrance become substantially closed off. This may prematurely disallow the Au via from being filled altogether. These defective partially-filled via are colloquially termed voids and depending on the nature of the close-off these voids can be of various shapes, sizes and location.

SUMMARY

The present disclosure seeks to address at least some of the difficulties discussed above. The disclosure provides example methods for gold (Au) TSM plating. TSM here is distinguished from Through Silicon Via (TSV) methods in that in TSM the Si is usually a sacrificial layer disposed above a metal seed layer and as such the deposition is intended to occur only in a via. A significant amount of gold deposition still occurs however on the Si field, typically occurring more severely at the via entrance. This spurious deposition is undesirable and, in some instances, a close-off of a via entrance may interrupt an Au via filling process. This interruption may cause or leave behind defective structures or partial fills and/or voids, and a highly non-uniform via filling. These and other issues are addressed in some examples by a cyclical deposition-etch treatment process, also referred to herein as an Etch Assisted Gold Through Silicon Mask (EAG-TSM). This process seeks in some examples to minimize Si field plating and maintain via entrance integrity, thus enabling complete via fill and the elimination of close-off voids, especially in high aspect ratio structures.

Thus, in some examples, a method for etch assisted gold (Au) through silicon mask plating (EAG-TSM) comprises: providing a seed layer on a substrate; providing a silicon mask on at least a portion of the seed layer on the substrate, the silicon mask including one or more via to be filled with Au; subjecting the masked substrate to at least one processing cycle, each processing cycle including an Au plating sub-step and an etch treatment sub-step; and repeating the at least one processing cycle until a selected via fill thickness is achieved.

In some examples, residual Au deposited adjacent a via by the plating sub-step is removed by the etch treatment sub-step. In some examples, a via-fill efficiency is based on a degree of via fill versus a degree of residual Au.

Some examples further comprise adjusting the via-fill efficiency based on an inclusion of Sulphur trioxide (SO3) a chemistry of the Au plating solution in the plating sub-step. Some examples further comprise adjusting the via-fill efficiency based on an inclusion of cyanide (CN) in a chemistry of the Au plating solution in the plating sub-step.

In some examples, an etchant in the etch treatment sub-step includes $I^-$ (Iodide)/$I^2$ (Iodine) in a 6:1 molar ratio. In some examples, an etchant in the etch treatment sub-step includes aqua-regia in a 1:3 molar ratio.

In some examples, a cycle time of a first cycle in the at least one cycle is equal to a cycle time of a second cycle in the at least one cycle. In some examples, a cycle time of a first cycle in the at least one cycle is not equal to a cycle time of a second cycle in the at least one cycle.

In some examples, a frequency of applying the etch treatment sub-step during a first period of subjecting the masked substrate to the at least one processing cycle is different to a frequency of applying the etch treatment sub-step during a second period of subjecting the masked substrate to the at least one processing cycle.

In some examples, a plating system for a method of etch assisted gold (Au) through silicon mask plating (EAG-TSM) is provided. IN some examples, the plating system comprises: a cathode; an anode; an in-situ substrate processing module configured to perform alternating sub-steps of at least one processing cycle, the sub-steps including an Au plating sub-step and an etch treatment sub-step, the processing module common to each sub-step operation; a robot to receive or transfer a substrate to the processing module, the substrate including a seed layer and a silicon mask on at least a portion of the seed layer on the substrate, the silicon mask including one or more via to be filled with Au by the plating system; a substrate holder; and an etchant delivery means operable to deliver etchant during the etch treatment sub-step.

In some examples, the substrate holder is operable to lower the substrate into an Au plating solution in the processing module during the Au plating sub-step and withdraw the substrate from the plating solution after the Au plating sub-step. In some examples, the substrate holder is further operable to hold the substrate in the path of an etchant during the etch treatment sub-step while the substrate holder is in the withdrawn position.

In some examples, the processing module is configured to repeat the at least one processing cycle until a selected via fill thickness is achieved.

In some examples, the substrate holder is configured to apply a selected substrate rotation speed during at least the etch treatment sub-step.

DESCRIPTION OF THE DRAWINGS

Some embodiments are illustrated by way of example and not limitation in the figures of the accompanying drawings.

DESCRIPTION

The description that follows includes systems, methods, and techniques that embody illustrative embodiments of the present invention. In the following description, for purposes of explanation, numerous specific details are set forth in order to provide a thorough understanding of example embodiments. It will be evident, however, to one skilled in the art that the present inventive subject matter may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Lam Research Corporation 2019-2020, All Rights Reserved.

There are certain difficulties when seeking, to form metal structures at a very small scale. As discussed above, forming structures at a micron level for example is most commonly done by plating operations using one or more pre-patterned sacrificial masks. One method employs an organic photoresist mask and is commonly referred to as through-resist plating. The WLP industry also widely uses such methods to form Cu and Au RDL, flip-chip-bump interconnects of Cu, Ni and Sn alloy solder, and Au bumping. Even more complex structures such as those found in MEMS applications also utilize through-resist plating technology.

Figure 1A:
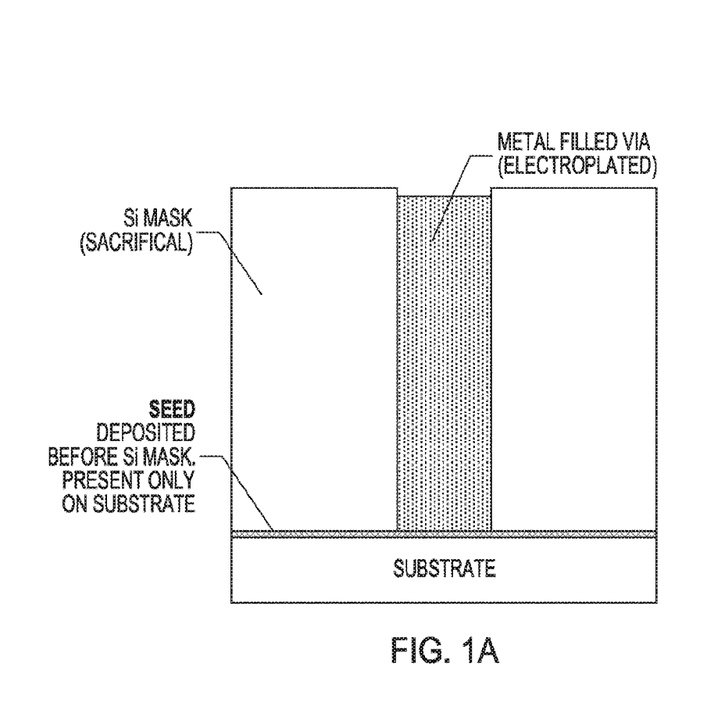
FIGS. 1A-1B are schematic diagrams illustrating example aspects of methods involving Through Silicon Mask (TSM) and a Through Silicon Via (TSV) techniques.
Figure 1B:
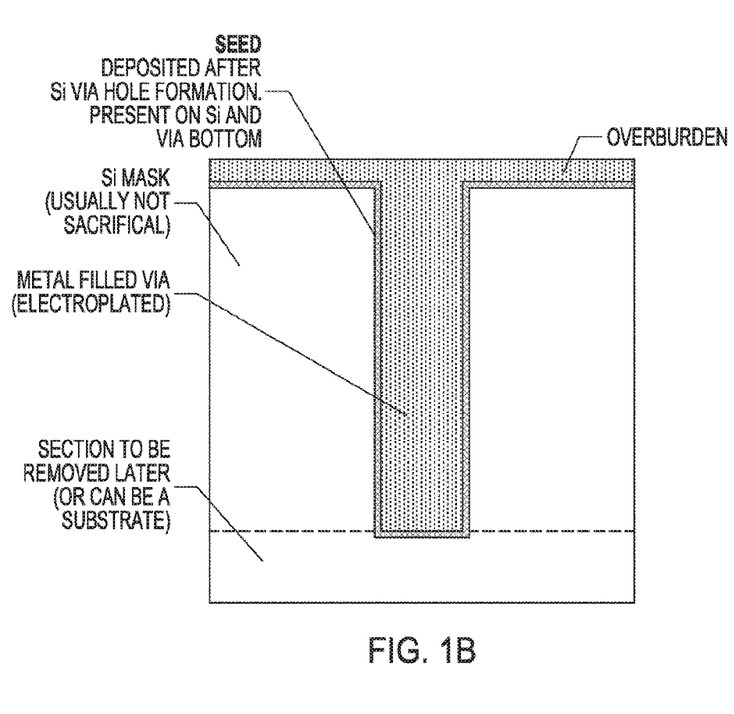

In some more specialized applications, there is a need to form large high aspect ratio (HAR) structures from gold metal. The dimensions of a large HAR structure may range roughly 2 to 50 µm (micron) laterally by 10 to 200 µm in height. The term 'via' is used herein to refer to empty spaces in a substrate or layer to be filled with metal, and the term 'via filling' is used herein to refer to metal deposition in these via. It is noted that such via are not necessarily round cylindrical in shape and may take on more complex shapes. Such large HAR dimensions can however prevent the use of more traditional organic photoresist masks. An alternate method includes the use of Si as a sacrificial mask. FIGS. 1A-1B depict respective schematic diagrams of example aspects of methods involving TSM and TSV techniques. TSM processes may be distinguished clearly from TSV processes in that integration schemes and plating deposition processes may be very different.

Figure 2A:
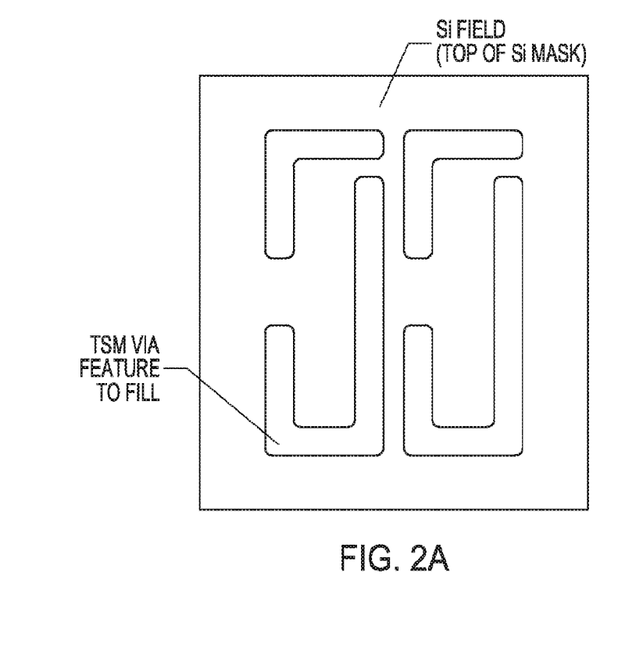
FIGS. 2A-2F illustrates schematic views certain field deposition irregularities, according to some examples.
Figure 2B:
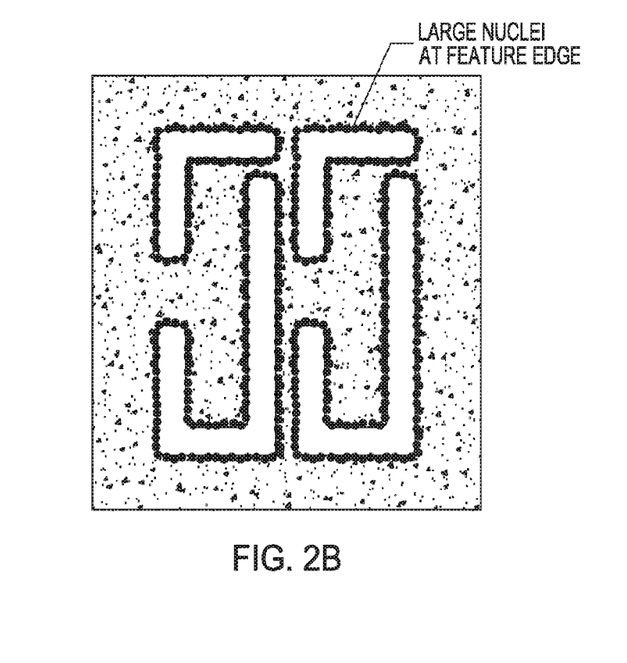
Figure 2C:
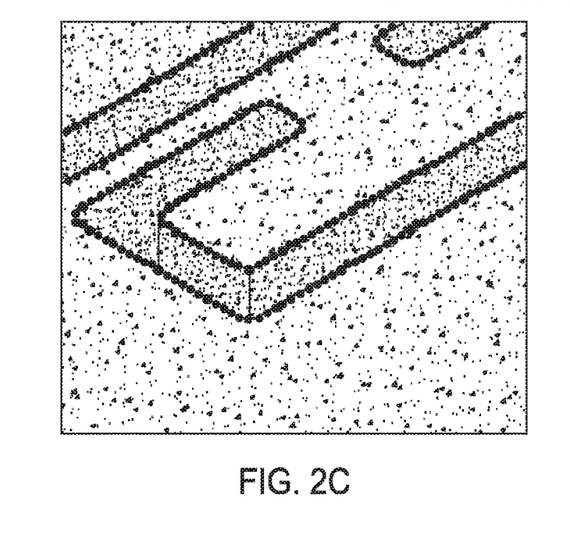
Figure 2D:
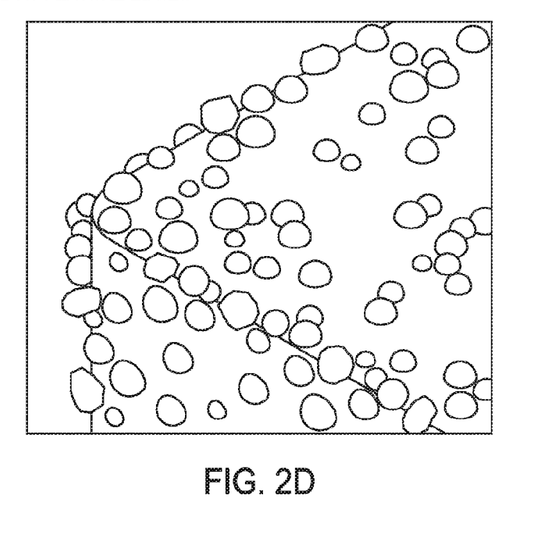
Figure 2E:
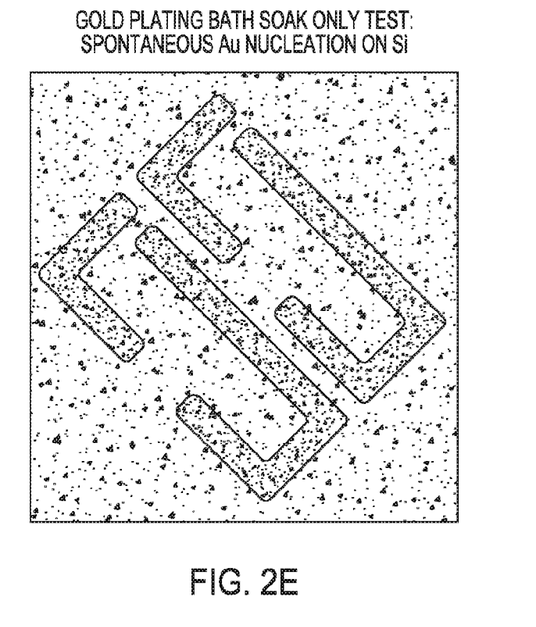
Figure 2F:
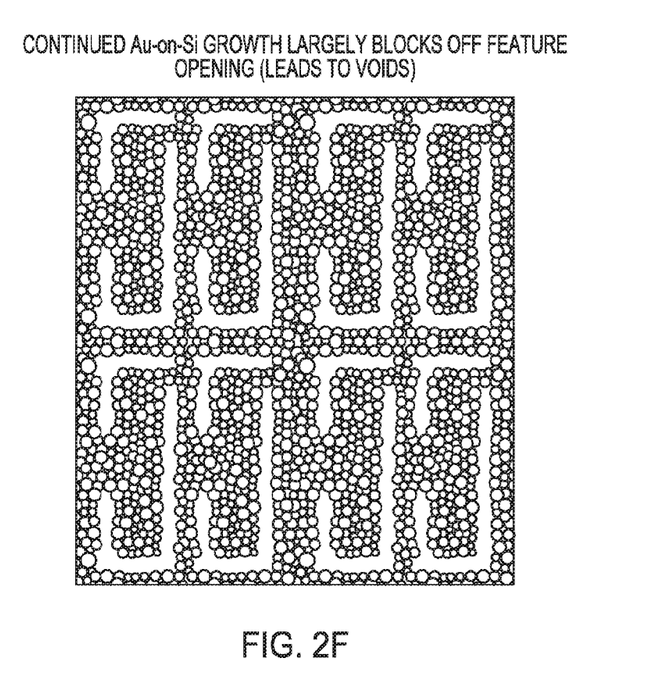
Figure 3A:
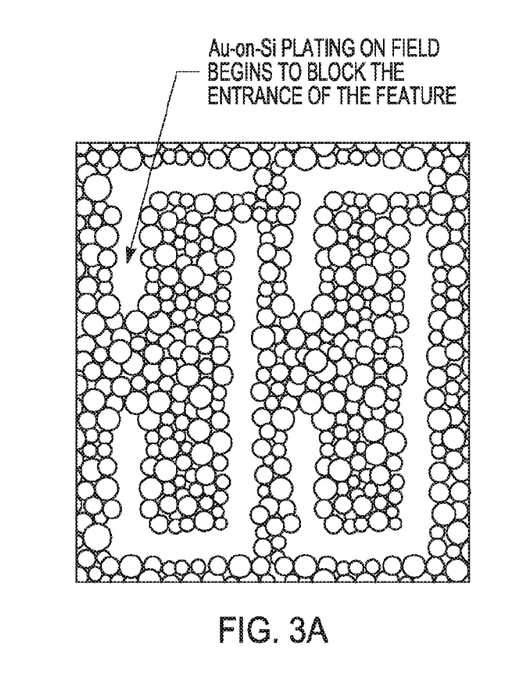
FIGS. 3A-3C depict sectional views of some example void defects.
Figures 3B, 3C:
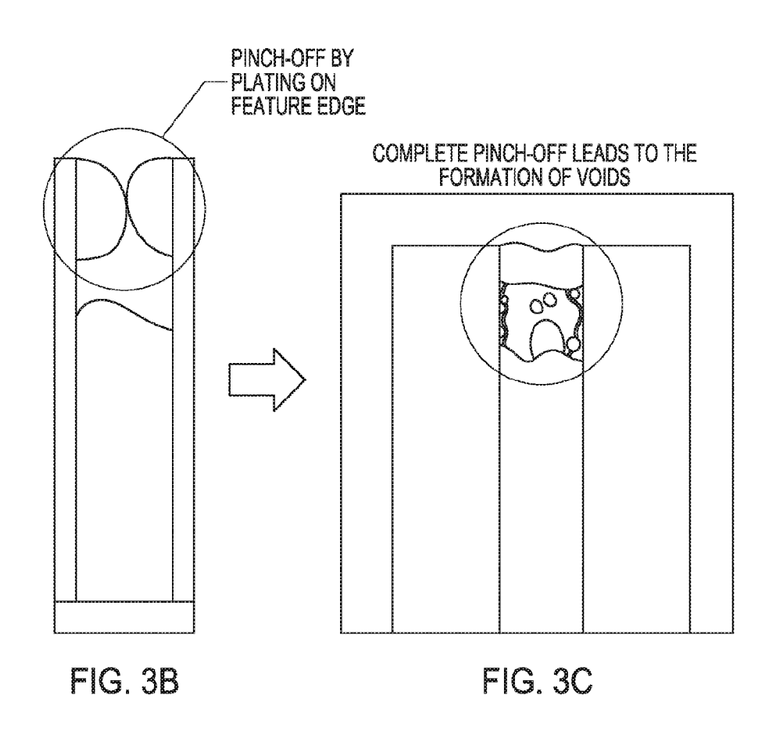

TSM plating with Au may present significant difficulties. The gold metal readily deposits spuriously on an Si mask, particularly at via openings. FIGS. 2B-2F show some examples of problematic field deposition formations and possible issues relating thereto when performing Au TSM on a masked substrate of FIG. 2A. Such undesired Au depositions on Si continue to grow, sometimes even more intensely at the via entrance which interferes with the desired Au via fill plating. Eventually the via entrance, or parts of the via entrance, are substantially closed off (see FIG. 3C for example), prematurely interrupting the Au via filling altogether. Such defective partially-filled via are colloquially termed voids and depending on the nature of the close-off these can be of various shapes, sizes and location. FIGS. 3A-3C depict examples of some of these defects (voids).

Figure 4:
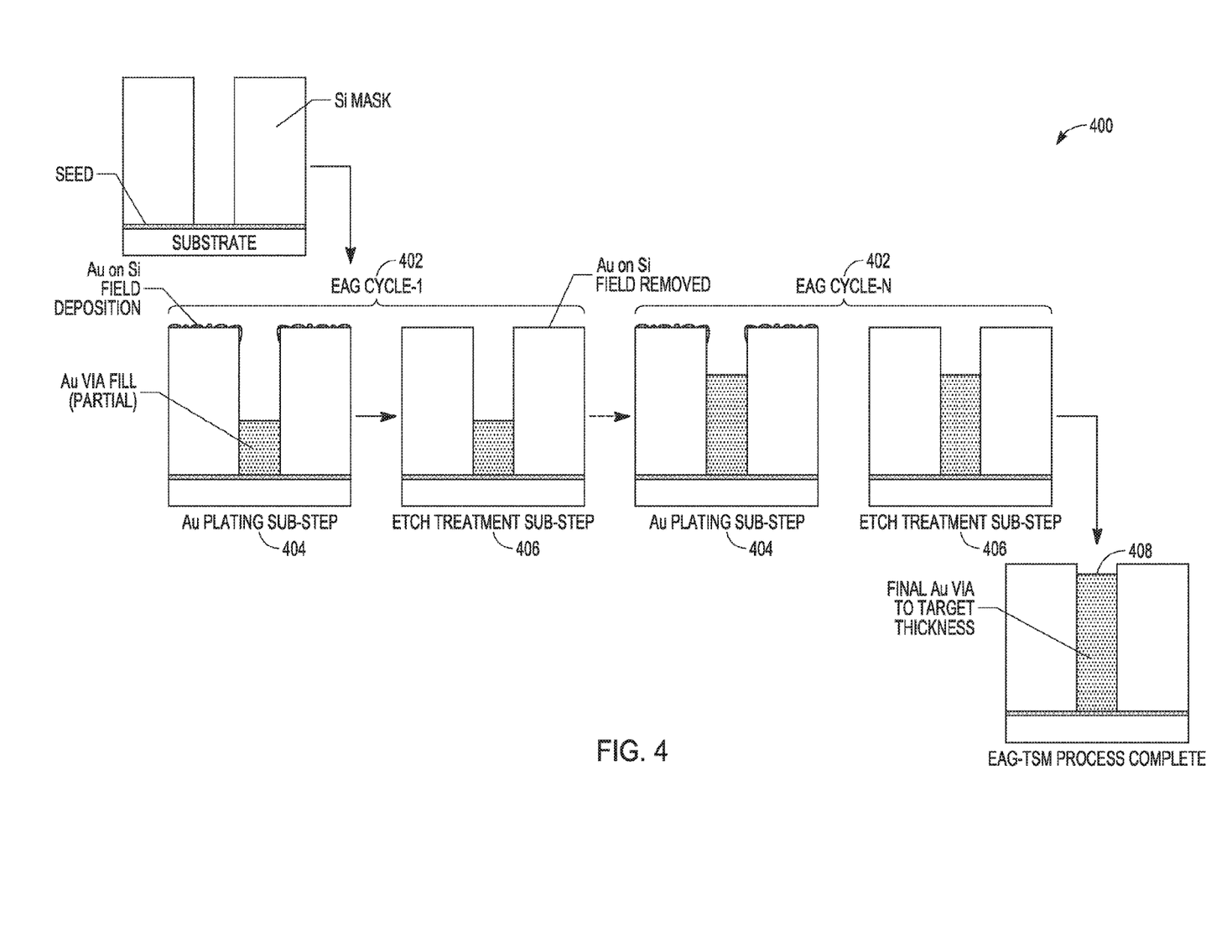
FIG. 4 illustrates example operations in an EAG-TSM method, according to example embodiments.

Turning to present examples that seek to address these issues, one approach for gold-based TSM includes a cyclical sequential plating-etch treatment method also termed Etch Assisted Gold TSM (EAG-TSM) herein. Example operations in such a method 400 are shown in FIG. 4. As illustrated, the method 400 may include phases or cycles 402 (for example, EAG cycle-I through EAG cycle-n, as shown). In some examples, each EAG cycle 402 in the EAG-TSM method 400 may include a plating sub-step 404 and an etch treatment sub-step 406 until a desired Au fill thickness 408 is achieved. During each etch treatment sub-step 406, residual (unwanted) Au on the Si field is removed to leave a clean field (as shown) for the next plating sub-step 404. The EAG-TSM method 400, including the alternating cycles 402, terminates once the desired Au via fill 408 has been achieved.

In some examples, an Au via-fill efficiency is defined during each deposition sub-cycle as a degree of via fill versus an unwanted Au-on-Si field deposition. Example fill efficiencies may be influenced by the gold chemistry (for example Sulphur trioxide $SO_3$ as opposed to cyanide (CN) based gold), the presence and/or type of additive and its concentration, processing conditions (for example, temperature, current density waveform, and convection to a lesser degree), and the deposition time of each sub-cycle. Deposition time may be a factor because spurious Au-on-Si field growth has been observed to hasten at longer deposition times (for example, >2 hrs). Without wishing to be bound by theory, it is believed that Au deposition rates are faster after substantial nucleation has taken place, and that the Au surface area available for reaction also becomes progressively larger. It may be noted that although Au-on-Si deposition is spontaneous in some examples, under optimal chemistry and process conditions it is still substantially less than the Au via fill, i.e. which has a favorable fill efficiency. Thus, a significant amount of Au filling may have taken place before proceeding to an etch treatment step to remove the spurious Si field deposition. The plating cycle time is optimized to prevent excessive Si plating, maintaining good Au via-filling characteristics including uniformity.

Example chemistry options are available for etching the spurious Au-on-Si field deposition. Options may include $I^-$ (Iodide)/$I^2$ (Iodine) (typically 6:1 molar ratio) and aquaregia (formulary mix of nitric and hydrochloric, usually at 1:3 molar ratio), which are compatible with an Si mask. Etchant concentration, enhancing additives, temperature and processing conditions may be optimized to yield desired etch rates. Etching of the Au-on-Si field may occur at a much higher rate than the Au-via-fill. This may be due to the existence of large geometrical differences which may impose very different mass transfer conditions. The field readily has good access to etchant molecule supply, while the via on the other hand is always etchant supply limited due to diffusion limitations. As a result, the Au-on-Si field deposition is effectively removed with minimal reduction of the Au-via fill product.

Each deposition and etch treatment sub-cycle time can also be individually optimized. For example, while filling roughly the first half of an example 50 µm via, relatively small amounts field deposition may be observed. At thicker via fills, these spurious Au-on-Si depositions tend to occur more readily. In some examples, an optimal EAG-TSM process will generally be one in which the initial sub-deposition fill target is large, followed by higher frequency dep-etch cycles at later stages.

Figure 5A:
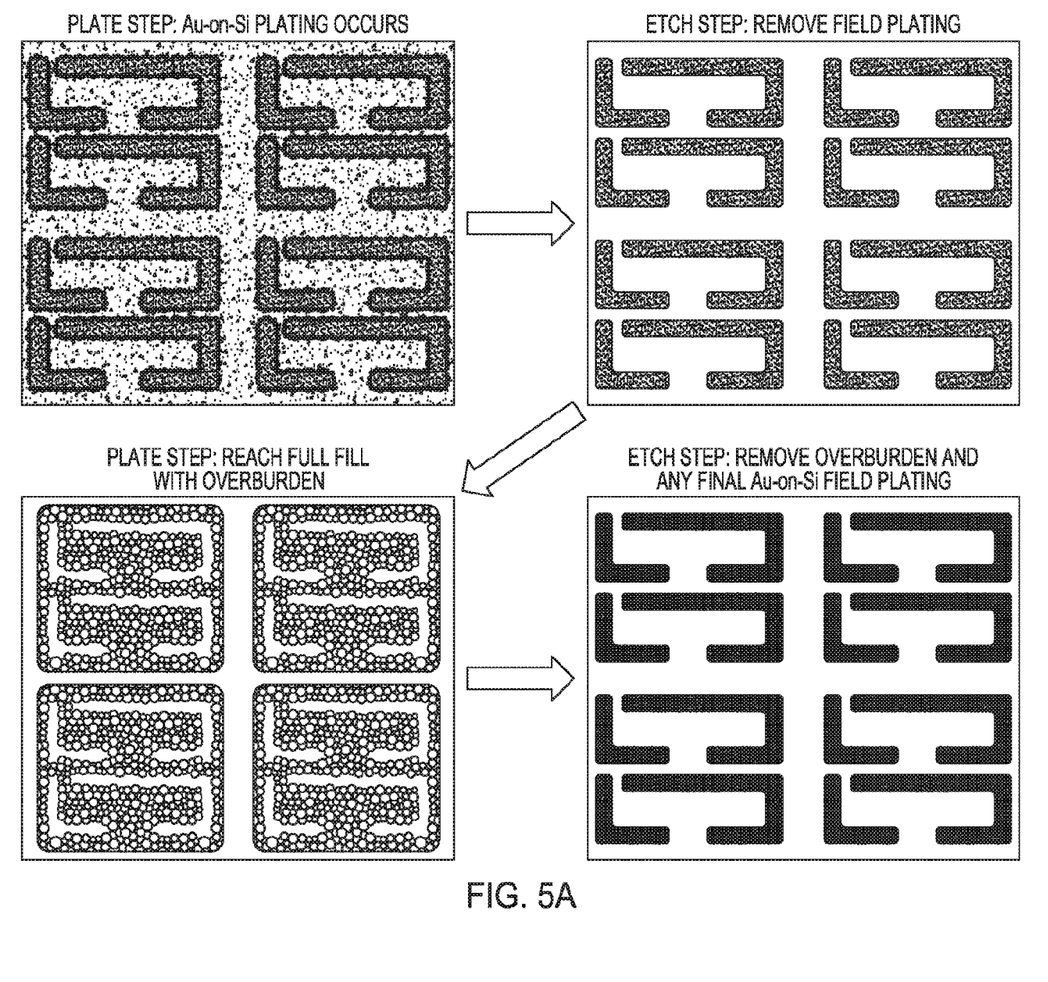
FIGS. 5A-5C illustrate aspects of example formations created by an example EAG-TSM process.
Figure 5B:
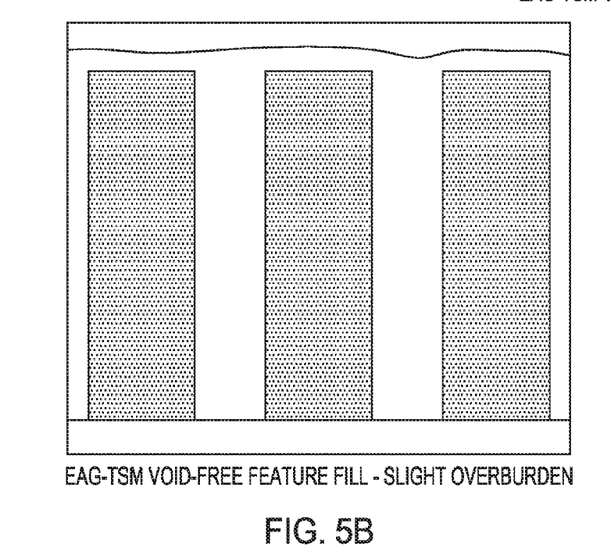
Figure 5C:
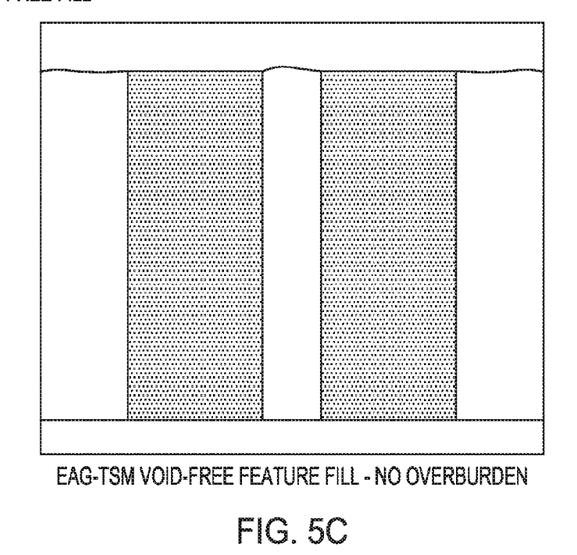

FIG. 5A illustrates aspects of example formations created by an example EAG-TSM process 500, or the method 400 described above. As shown at 502 and 504, the spurious Au-on-Si field deposition is well removed after each etch treatment cycle in the alternating series of plate and step operations 500. Process cycle times, especially on final stages thereof can be tuned to help minimize final overburden, which is defined as the amount of Au-on-Si field deposition. Respective sectional views of examples with slight and no overburden are shown in FIGS. 5B-5C.

Some further examples include implementation of EAG-TSM from an equipment-machine design perspective. An example implementation design may be classified according to the following classes: class (I) ex-situ etch, or class (II) in-situ etch.

A class (I) example may include deposition and etch treatment phases in two separate process modules wherein the main function of each is directed to respective plate and etch treatment processes only. A wafer processed in this arrangement will typically be required to be transferred (usually facilitated by a robot) between the plate and etch modules during each cycle. An example plating cell may include certain elements optimized to produce good quality gold plating. Similarly, an etch module may also be optimized for quality etch treatment. Thus, for example, an etch treatment module may include (a) a dispense technique or (b) adopt an immersion approach. In option (a) employing the dispense technique, a set of nozzles delivers etchant liquid on to a wafer surface only during processing. Etchant effluent, if still sufficiently potent, can be reclaimed for later reuse. On the other hand, the option (b) immersion approach immerses the wafer into an etchant bath. This can be an attractive method from a process and design simplicity perspective.

Figure 6:
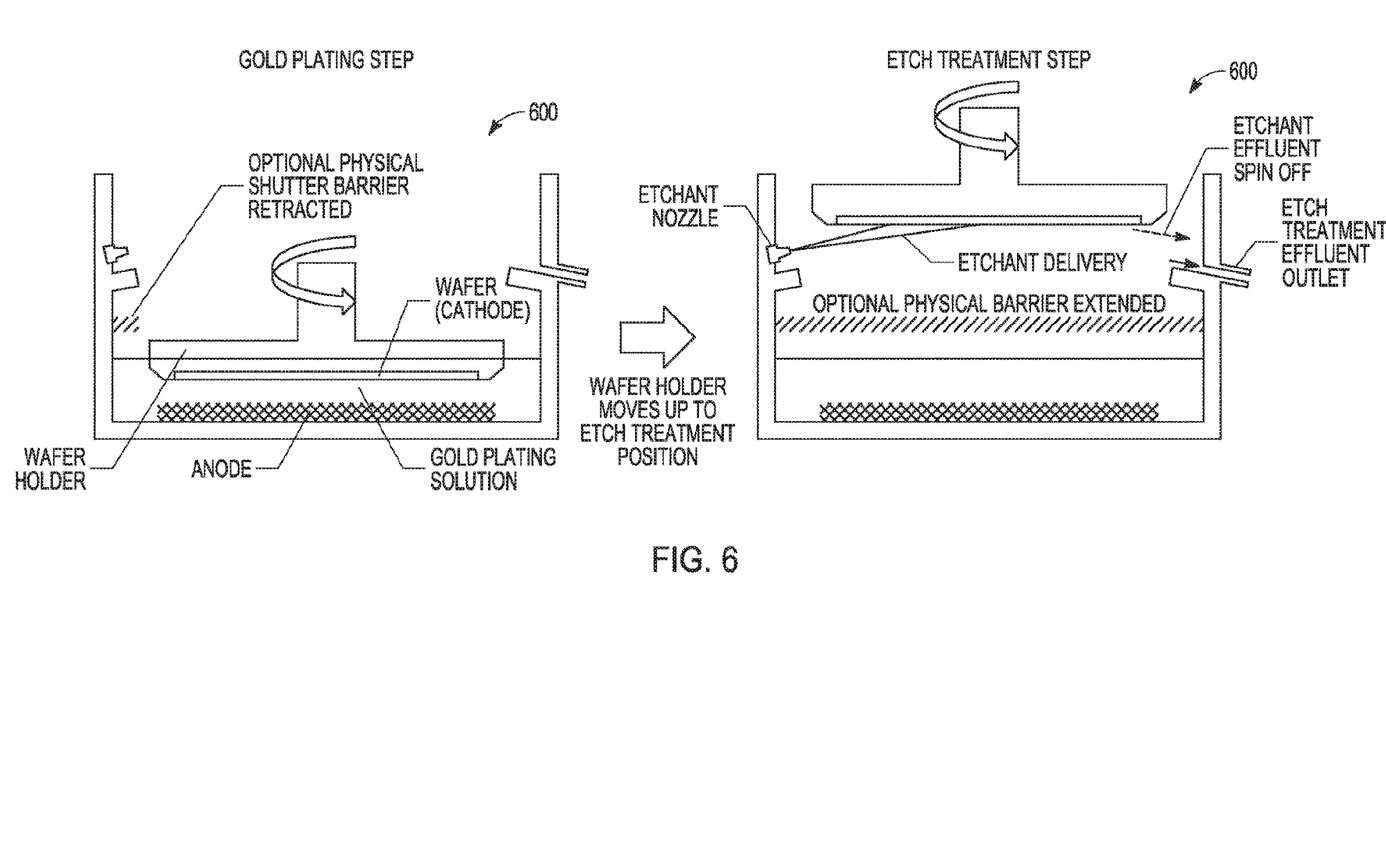
FIG. 6 shows sectional views of a processing module, according to an example embodiment.

The class (II) in-situ design approach may combine in some examples both the deposition and etch treatment in the same process module. An example of such a module 600 is depicted in FIG. 6. In some examples, the same module (or plating cell) 600 performs a gold plating step and an etch treatment step. The steps may alternate repeatedly in a series. One step may be repeated a number of times before the alternate step (or cycle) is performed. Thus, for example, two plating steps followed by an etching step, then one plating step followed by three etching steps, and so forth. Many variations are possible.

As shown, at the end of a plating cycle, a wafer holder removes (in the right-side view) a processed wafer out of the illustrated plating solution. One or more sets of nozzles (e.g. as illustrated) within the module 600 rinse the withdrawn wafer, initially with water and then with etchant in preparation for an etch treatment step. In some examples, high wafer rotation speeds are applied during the rinse and etch treatment steps to help divert rinsate and etch treatment effluent from entering the plating cell bath. As shown, a movable barrier such as a shutter may also be retracted or advanced to further minimize contaminating the plating solution bath.

Thus, in some embodiments, an EAG-TSM cyclical plate-etch treatment is provided as a combinatory process. Examples may provide certain differentiating characteristics and benefits. A resolution of problems associated with close-off related void defects may be provided. Due to the defect-inhibiting nature of EAG-TSM processes, some examples may be deployed successfully to form thick or tall via structures and achieve no-defect performance levels higher than conventional plating processes. Some examples address production issues relating to excessive spurious Au-on-Si field deposition. Example EAG-TSM processes can produce minimal Au-on-Si deposition at levels otherwise not achievable with conventional plating process. Some example EAG-TSM processes facilitate the minimization or even complete removal of Au overburden. Some examples allow independent control, tuning, and optimization of via fill deposition versus Au-on-Si field deposition.

Although an embodiment has been described with reference to specific example embodiments, it will be evident that various modifications and changes may be made to these embodiments without departing from the broader scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The invention claimed is:

1. A method for etch assisted gold (Au) through silicon mask plating (EAG-TSM), the method comprising:
    providing a seed layer on a substrate;
    providing a silicon mask on at least a portion of the seed layer on the substrate, the silicon mask including one or more via to be filled with Au;

subjecting the masked substrate to at least one processing cycle, each processing cycle including an Au electroplating sub-step and a chemical etch treatment sub-step; and repeating the at least one processing cycle for a number of repeated cycles until a selected via fill thickness is achieved, wherein each repeat of the at least one processing cycle includes an alternation between the Au electroplating sub-step and the chemical etch treatment sub-step, wherein in each Au electroplating sub-step, residual Au is deposited on the silicon mask along with a deposition of the Au in the one or more via, the residual Au partially blocking the one or more via; and wherein in each chemical etch treatment sub-step, residual Au deposited on the silicon mask is etched away to unblock the one or more via for the deposition of the Au in the one or more via in the Au electroplating sub-step of a succeeding processing cycle.

2. The method of claim 1, further comprising determining a via-fill efficiency based on a degree of via fill versus a degree of residual Au.

3. The method of claim 2, further comprising adjusting the via-fill efficiency based on an inclusion of Sulphur trioxide ($SO_3$) in a chemistry of an Au electroplating solution in the electroplating sub-step.

4. The method of claim 2, further comprising adjusting the via-fill efficiency based on an inclusion of cyanide (CN) in a chemistry of an Au electroplating solution in the electroplating sub-step.

5. The method of claim 1, wherein an etchant in the chemical etch treatment sub-step includes $I^-$ (Iodide)/$I^2$ (Iodine) in a 6:1 molar ratio.

6. The method of claim 1, wherein an etchant in the chemical etch treatment sub-step includes aqua-regia in a 1:3 molar ratio.

7. The method of claim 1, wherein a cycle time of a first cycle in the number of repeated cycles is equal to a cycle time of another cycle in the number of repeated cycles.

8. The method of claim 1, wherein a cycle time of a first cycle in the number of repeated cycles is not equal to a cycle time of another cycle in the number of repeated cycles.

9. The method of claim 1, wherein a frequency of applying the chemical etch treatment sub-step during a first period of subjecting the masked substrate to the at least one processing cycle is different to a frequency of applying the chemical etch treatment sub-step during a second period of subjecting the masked substrate to the at least one processing cycle.

10. The method of claim 1, wherein an Au electroplating solution used in the Au electroplating sub-step is different from an etchant used in the chemical etch treatment sub-step.

11. The method of claim 1, wherein the Au electroplating sub-step and the chemical etch treatment sub-step are performed in two separate process modules.

12. The method of claim 1, wherein the chemical etch treatment sub-step comprises:

delivering, via a set of nozzles, an etchant to the residual Au deposited on the silicon mask.

* * * * *